(12) United States Patent
Tonozuka

(10) Patent No.: US 6,439,917 B2
(45) Date of Patent: Aug. 27, 2002

(54) MECHANISM FOR PREVENTING ELECTRONIC UNIT FROM BEING PULLED OUT FROM HOUSING UNDER CONDITION THAT ELECTRONIC UNIT IS CONNECTED WITH PLUG

(75) Inventor: Kazutoshi Tonozuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/729,919

(22) Filed: Dec. 6, 2000

(30) Foreign Application Priority Data

Dec. 10, 1999 (JP) .......................... 11-351742

(51) Int. Cl.[7] .............................. H01R 13/62
(52) U.S. Cl. ...................... 439/372; 439/911
(58) Field of Search .................. 439/299, 300, 439/911, 372

(56) References Cited

U.S. PATENT DOCUMENTS 5,735,701 A * 4/1998 Jarrett .......................... 439/147
5,949,652 A * 9/1999 McAnally et al. ........... 361/726

FOREIGN PATENT DOCUMENTS

JP          5-3414       8/1993
JP          11-162577    6/1999

* cited by examiner

Primary Examiner—Khiem Nguyen
(74) Attorney, Agent, or Firm—Whitham, Curtis & Christofferson, P.C.

(57) ABSTRACT

An electronic unit having an electric connecting part connectable with a plug is accommodated in a housing of an electronic equipment so that the electronic unit can be attached to and detached from the housing. An engaging arm is rotatably mounted on one face of the electronic unit on which the electric connecting part is provided. When a plug is connected to the electric connecting part of the electronic unit, one end of the engaging arm is engaged with the engaging portion of the housing, whereby the electronic unit can be prevented from being pulled out from the housing. When the plug is detached from the electric connecting part of the electronic unit, the engaging portion of the engaging arm can be disengaged from the housing by the rotation of the engaging arm. Therefore, if the plug is detached from the electric connecting part of the electronic unit, the electronic unit can be pulled out from the housing. If the electronic equipment is arranged as above, the electronic unit can be prohibited from being pulled out from the housing of the electronic equipment under condition that the plug is connected to the electric connecting part of the electronic unit and power is supplied to the electronic unit through the plug.

4 Claims, 3 Drawing Sheets

MECHANISM FOR PREVENTING ELECTRONIC UNIT FROM BEING PULLED OUT FROM HOUSING UNDER CONDITION THAT ELECTRONIC UNIT IS CONNECTED WITH PLUG

BACKGROUND OF THE INVENTION

1. Field of the Invention:

The present invention relates to a pull-out preventing mechanism for use with an attachment electronic unit housed within a housing of an electronic equipment which is arranged so that the attachment electronic unit can be attached to and detached from the housing. The present invention also relates to the electronic equipment having the pull-out preventing mechanism.

2. Description of the Related Art:

Recently, an information-oriented society has been rapidly developed and each member of society is deeply involved in the orientation in terms of its individual use of data terminal equipment or electronic equipment. When the electronic equipment such as a personal computer is utilized in a firm or the like, such electronic equipment tends to be operated in a day-and-night manner in order to provide service to its customer. Thus, if the electronic equipment comes to be uncontrollable due to any trouble or the like, a lot of inconvenience will be imposed on the customer. For this reason, the electronic equipment is requested to be more reliable. So, makers supplying the electronic equipment have responded to the request in such a manner that a main unit of the electronic equipment is arranged to have redundancy. That is, the electronic equipment is designed so that even if one of the attachment electronic units housed within the electronic equipment suffers from trouble, the electronic equipment is free from an uncontrollable state and hence always sustainable in day-and-night operation.

For example, if the electronic equipment is operated in a day-and-night manner as described above and one of the attached electronic unit provided in the electronic equipment suffers from trouble, the electronic equipment will be electrically influenced from noise or the like, with the result that the electronic equipment fails to function normally. In the worst case, the whole arrangement of the electronic equipment can be broken. Thus, when an operator deals with the electronic equipment, closest attention shall be paid. Accordingly, when the attached electronic unit provided in the electronic equipment suffers from trouble, it is necessary for the attachment electronic unit to be detached from the main body of the electronic equipment.

FIG. 1 is a diagram showing one example of a conventional electronic equipment. As shown in FIG. 1, electronic equipment 71 has an attachment electronic unit 51 housed therein. Housing 52 constituting electronic equipment 71 has attachment electronic unit 51, a main unit, not shown, or the like accommodated therein. Attachment electronic unit 51 is formed into a substantial box shape. On front face 51a of attachment electronic unit 51, there are provided handle 60 for detaching attachment electronic unit 51 from housing 52, switch 58 for turning on or off the attachment electronic unit, inlet 56 to which power supply plug 59 is inserted and electric power is supplied to the attachment electronic unit. On the rear face of attachment electronic unit 51, there is provided plug-in connector 51b through which signal transaction is effected with another unit.

On the other hand, housing 52 is formed to have an accommodating portion at which attachment electronic unit 51 is attached to or detached from. Opening 53 of the accommodating portion is formed on one face of housing 52. On an inner wall of housing 52, there is provided a connector corresponding to plug-in connector 51b which is disposed on one rear face of attachment electronic unit 51. When attachment electronic unit 51 is housed within housing 52, plug-in connector 51b is connected to a mating connector provided within housing 52.

When attachment electronic unit 52 is housed within housing 52, initially, the rear portion of attachment electronic unit 51 is inserted into opening 53 and then the whole body of attachment electronic unit 51 is inserted into housing 52 by using handle 60. Thus, substantially the whole body of attachment electronic unit 51 can be accommodated within housing 52. Housed attachment electronic unit 51 can be fixed in such a manner that plug-in connector 51b is matched with the mating connector provided within housing 52. Thereafter, attachment electronic unit 51 is fastened to housing 52 by using screws 61.

After attachment electronic unit 51 is fixed to housing 52, power supply plug 59 connected at one end of a cable is inserted into power receiving inlet 56. Then, power switch 58 is turned on so that attachment electronic unit 51 is energized. When attachment electronic unit 51 is to be replaced with another attachment electronic unit due to trouble with attachment electronic unit 51, power switch 58 is turned off and then power supply plug 59 is pulled out from power receiving inlet 56. Thereafter, screws 61 are removed from housing 52 and attachment electronic unit 51 is pulled out from housing 52.

However, the structure of the conventional electronic equipment shown in FIG. 1 encounters the following drawbacks. Initially, when attachment electronic unit 51 of electronic equipment 71 is to be replaced with another attachment electronic unit, an operator tends to leave power supply plug 59 connected to attachment electronic unit 51. When attachment electronic unit 51 is replaced with another unit, if power switch 58 is turned on and power supply plug 59 is left connected to power receiving inlet 56, attachment electronic unit 51 is pulled out from housing 52 under condition that attachment electronic unit 51 is energized. In this case, other units or the like within electronic equipment 71 can suffer from excessive current flow or noise can be generated. The excessive current or noise can influence circuits under operation, with the result that the energized circuits can fail to function normally. If the malfunction caused under the above condition is not serious, breakdown of electronic equipment 71 will be avoided. However, if the malfunction caused under the above condition is serious, electronic equipment 71 can break down.

SUMMARY OF THE INVENTION

An object of the present invention is to provide a pull-out preventing mechanism of an attachment electronic unit which can prohibit a user from unintentionally pulling out the attachment electronic unit from a housing when the attachment electronic unit housed within the housing to be detachable is replaced with another electronic unit under condition that the attachment electronic unit is connected with a power supply plug. Also, an object of the present invention is to provide an electronic equipment having such a pull-out preventing mechanism.

According to the present invention, if an electronic unit is housed within a housing of an electronic equipment so that the electronic unit can be attached to and detached from the housing, the electronic unit can be prevented from being pulled out from the housing under condition that the electronic unit is connected at its electric connecting part with a plug. More concretely, an engaging arm rotatably mounted on the electronic unit is engaged with an engaging portion provided on the housing, whereby the electronic unit can be prevented from being pulled out from the housing. With this arrangement, for example, if the electronic unit is connected at its electric connecting part with the plug and the electronic unit is energized through the plug, an operator can be prohibited from unintentionally pulling the electronic unit out from the housing of the electronic equipment. When the electronic unit is to be replaced with another electronic unit due to trouble caused in the electronic unit, the operator shall detach the plug from the electric connecting part of the electronic unit which is housed within the housing, and thereafter the operator pulls the attachment electronic unit out from the housing under the condition that the plug is removed from the electronic unit. According to the above arranged electronic equipment, the pull-out preventing mechanism for preventing the electronic unit from being pulled out from the housing will not be unlocked so long as the plug is detached from the electric connecting part of the electronic unit. Therefore, the electronic unit can be positively prevented from being pulled out from the housing under condition that the plug is connected to the electric connecting part of the electronic unit. With this arrangement, for example, if the operator unintentionally leaves the plug connected to the electronic unit, the operator can be prohibited from pulling the electronic unit out from the housing. In other words, when the operator intends to pull the electronic unit out from the housing, the operator is obliged to disconnect the plug from the electronic unit to completely cut the passage of power supply to the electronic unit. In this way, when the electronic unit is to be replaced with another electronic unit, the electronic equipment will be free from excessive current flow or noise generation at a portion other than the electronic unit. As a result, the circuits under operation can be free from influence coming from the excessive current flow or from noise. Accordingly, a malfunction can also be avoided in electronic unit under operation different from the electronic unit. Further, the electronic equipment having an attachment electronic unit which can be replaced with another electronic unit will not be deteriorated in its original performance. Therefore, the electronic equipment can be utilized with reliability.

The above and other objects, features and advantages of the present invention will become apparent from the following description with reference to the accompanying drawings which illustrate an example of the present invention.

DETAILED DESCRIPTION OF THE PREFERRED EMBODIMENTS

Figure 1:
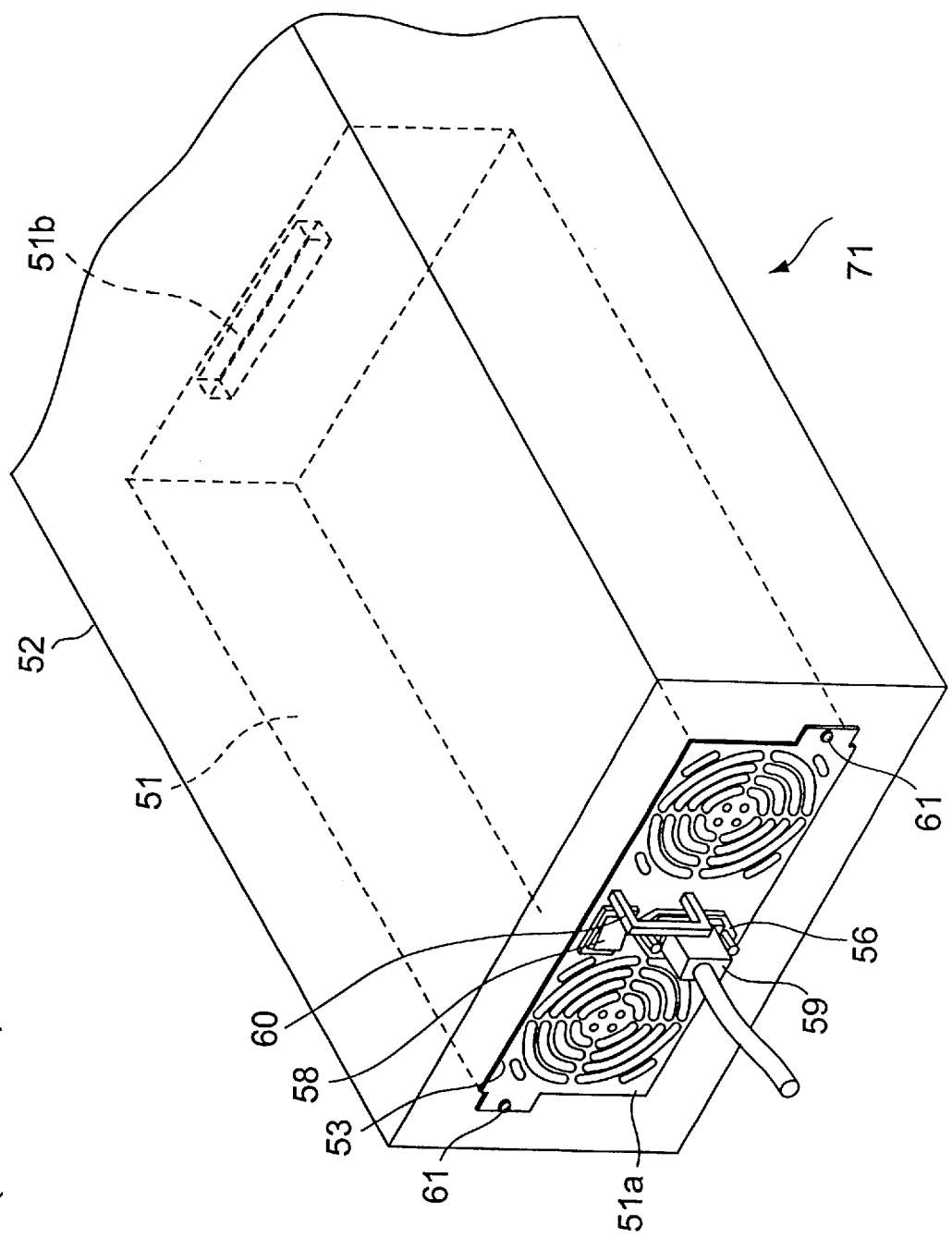
FIG. 1 is an oblique view of a part of a set of conventional electronic equipment in which an attachment electronic unit is provided.
Figure 2:
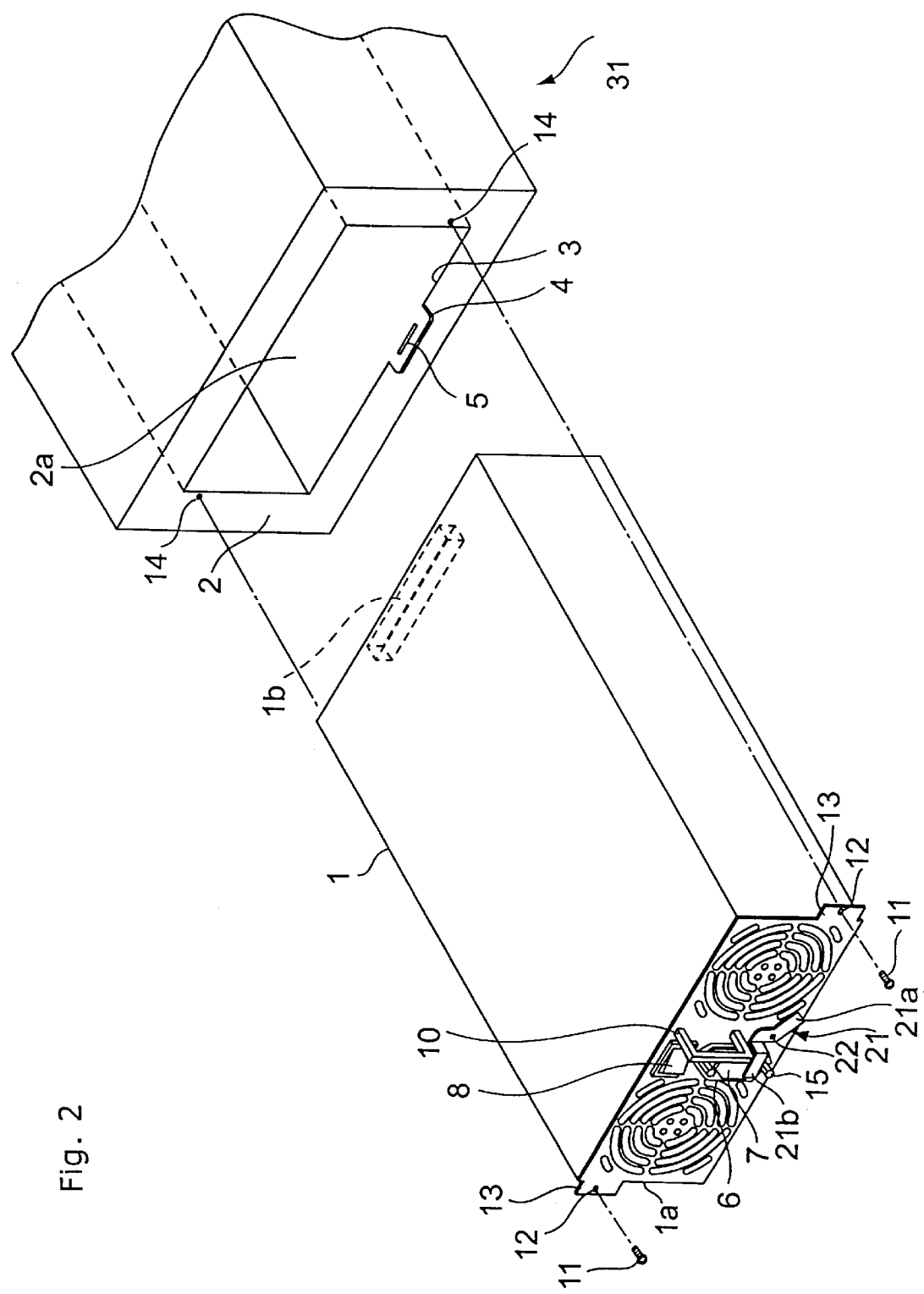
FIG. 2 is an oblique view of a set of electronic equipment according to one embodiment of the present invention in which a part thereof is illustrated in an exploded fashion.

FIG. 2 is an oblique view of a set of electronic equipment according to one embodiment of the present invention. As shown in FIG. 2, electronic equipment 31 of the one embodiment of the present invention includes housing 2 constituting electronic equipment 31, and attachment electronic unit 1 is housed within housing 2 so that attachment electronic unit 1 can be attached to and detached from housing 2. Attachment electronic unit 1 is substantially shaped into a box. When attachment electronic unit 1 is housed in housing 2, front face 1a of attachment electronic unit 1 is exposed to the outside. Attachment electronic unit 1 has on its front face 1a handle 10 utilized when an operator attaches electronic unit 1 to or detaches the same from housing 2. Attachment electronic unit 1 also has on its front face 1a power switch 8, power receiving inlet 6, engaging arm 21 serving as pull-out preventing means. Power receiving inlet 6 is formed to have plug insertion recess 7. Plug insertion recess 7 is arranged to receive power supply plug 9 which will be described later on with reference to FIG. 3.

Further, attachment electronic unit 1 is provided with plug-in connector 1b on an upper portion of a face which is opposite to front face 1a, i.e., the rear face of attachment electronic unit 1. Plug-in connector 1 is electrically connectable with another electric part which is different from attachment electronic unit 1.

Set of electronic equipment 31 is arranged to have pull-out preventing mechanism which prevents attachment electronic unit 1 from being pulled out from housing 2 under condition that power supply plug 9 is connected to power receiving inlet 6. The pull-out preventing mechanism is composed of engaging arm 21 attached to attachment electronic unit 1 and engaging portion 4 formed to project from one face of opening 3 of housing 2. Engaging portion 4 is formed to have slot 5 which can be engaged with one end of engaging arm 21. Engaging arm 21 is mounted on front face 1a of attachment electronic unit 1 near power receiving inlet 6 so that engaging arm can be rotated around pin 22. Thus, engaging arm 21 can be rotated on an axis of pin 22 which is perpendicular to front face 1a. When engaging arm 21 is rotated, as will be described later on, one end of engaging arm 21 is inserted into slot 5 or detached from the same.

Engaging arm 21 is formed into a V-letter shape as viewed from the side of front face 1a when engaging arm 21 is mounted on attachment electronic unit 1. The rotation axis of engaging arm 21 is disposed in the bending portion of the V-letter shape and engaging arm 21 is supported so as to be rotatable around pin 22. One end of engaging arm 21 opposite to the end of the same on the side of power receiving inlet 6, serves as insertion portion 21a which is to be inserted into slot 5. Further, the other side of engaging arm on the side of power receiving inlet 6 serves as lid portion 21b. When engaging arm 21 is rotated in one direction, plug insertion recess 7 is covered at its lower portion with lid portion 21b. Conversely, when engaging arm 21 is rotated in the other direction opposite to that direction, lid portion 21a is moved and plug insertion recess 7 is entirely opened.

Front face 1a of attachment electronic unit 1 is formed to have projecting portion 15 at a lower portion of plug insertion recess 7 of power receiving inlet 6. As shown in FIG. 2, when engaging arm 21 is rotated in one direction so that lid portion 21a abuts on upper surface of projecting portion 15, engaging arm 21 is placed at a first stop position. If engaging arm 21 is free from any external force, engaging arm 21 is rotated in this direction around pin 22 and lid portion 21a is moved downwardly. When lid portion 21a rests on projecting portion 15, engaging arm 21 is placed at the first stop position. When engaging arm 21 is placed at the first position, plug insertion recess 7 is covered at it lower portion with lid portion 21a and insertion portion 21a is retracted from the lower edge of front face 1a.

Housing 2 is provided with accommodating portion 2a as a space for accommodating attachment electronic unit 1 so that attachment electronic unit 1 can be attached to or detached from housing 2. Thus, housing 2 is formed to have opening 3 of accommodating portion 2a on one face of housing 2. On the lower edge of opening 3 of housing 2, there is partly formed engaging portion 4 of a plate shape protruding perpendicularly with respect to the face of opening 3. At the proximal side of engaging portion 4 near opening 3, there is formed slot 5 extending in a direction parallel to the face of opening 3. When attachment electronic unit 1 is housed within housing 2 and insertion portion 21a of engaging arm 21 is inserted into slot 5, insertion portion 21a is engaged with engaging portion 4. In this way, attachment electronic unit 1 is fixed to housing 2 and attachment electronic unit 1 is prohibited from being pulled out from housing 2.

Front face 1a of attachment electronic unit 1 has fixing tab 13 projecting from an upper end portion of one side of the front face of attachment electronic unit 1. Front face 1a of attachment electronic unit 1 also has fixing tab 13 projecting from a lower end portion of the other side of the front face of attachment electronic unit 1. Each of two tabs 13 is formed to have fixing holes 12 through which screw 11 is threaded. Front face 1a of the side of opening 3 of housing 2 is provided with two tapped holes 14 so as to correspond to fixing holes 12, and screws 11 are threaded into tapped holes 14, respectively. Tapped holes 14 are provided so as to correspond to fixing holes 12 of attachment electronic unit 1, respectively. When screws 11 are threaded into tapped holes 14 through fixing holes 12 of attachment electronic unit 1, attachment electronic unit 1 can be fixed to housing 2.

Figure 3:
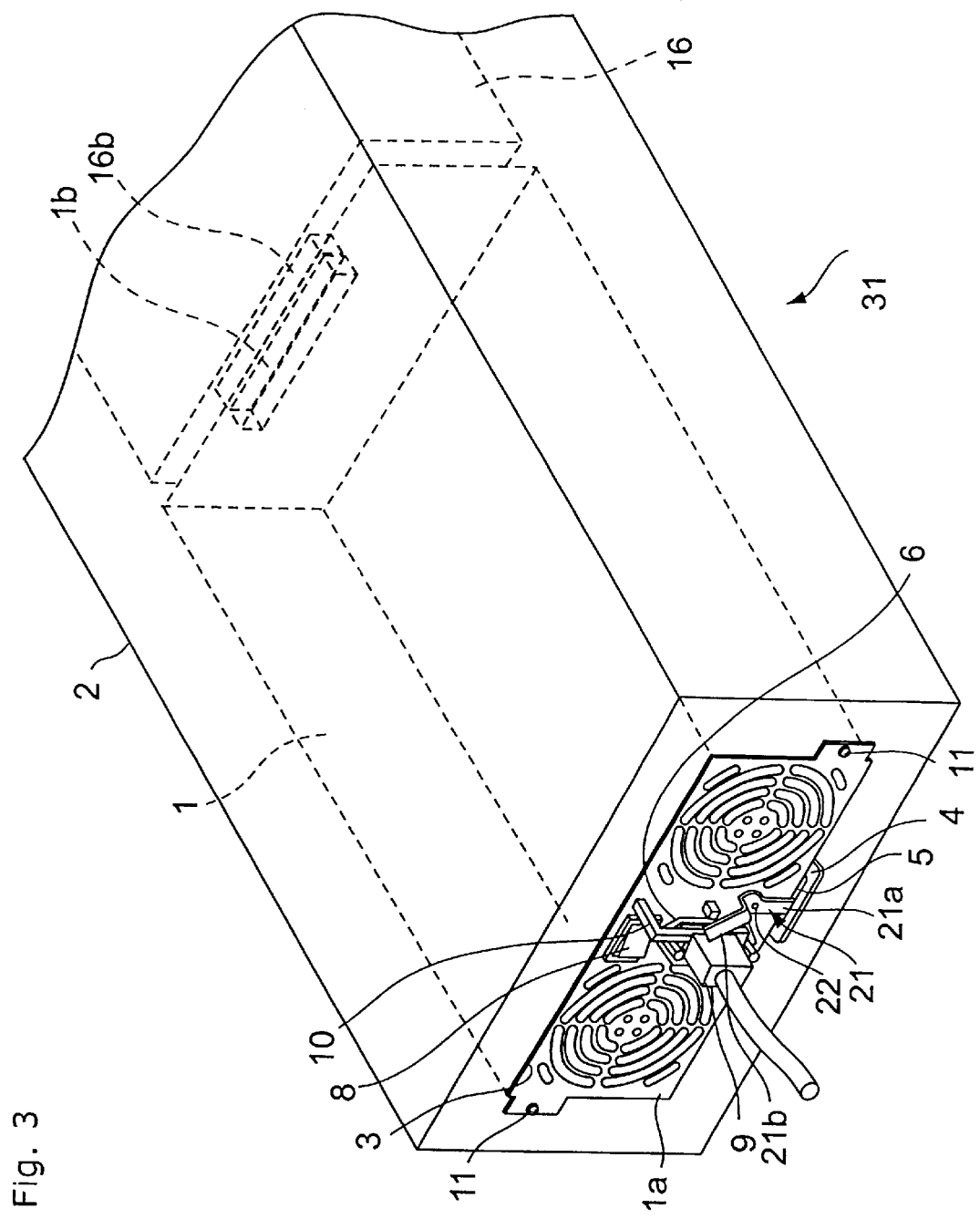
FIG. 3 is an oblique view of a set of electronic equipment having a housing in which the attachment electronic unit shown in FIG. 2 is accommodated.

FIG. 3 is a diagram showing housing 2 in which attachment electronic unit 1 is accommodated. Although not completely shown in FIG. 3, housing 2 has other electronic component such as main unit 16 accommodated therein, in addition to attachment electronic unit 1. On the upper portion on the side of accommodating portion 2a of main unit 16, there is provided plug-in connector 16b corresponding to plug-in connector 1b which is provided on the rear face of attachment electronic unit 1. When attachment electronic unit 1 is inserted into housing 2, plug-in connector 1b is connected to plug-in connector 16b. In this way, circuit components provided within attachment electronic unit 1 are electrically connected to circuit components provided within main unit 16 through plug-in connector 1b and plug-in connector 16b. In other words, signal transaction can be carried out between main unit 16 and attachment electronic unit 1 through plug-in connector 1b and plug-in connector 16b.

Operation of the pull-out preventing mechanism of attachment electronic unit 1 in the set of electronic equipment 31 will hereinafter be described on the basis of attaching and detaching operation of attachment electronic unit 1 with respect to housing 2.

When attachment electronic unit 1 is accommodated within housing 2, initially, the rear portion of attachment electronic unit 1 having plug-in connector 16b provided is inserted into opening 3 of housing 2. Then, attachment electronic unit 1 is inserted into housing 2 by using handle 10, thus attachment electronic unit 1 is moved into the depth of accommodating portion 2a of housing 2. In this way, substantially the whole body of attachment electronic unit 1 is housed within accommodating portion 2a of housing 2. Attachment electronic unit 1 accommodated within housing 2 is fixed in such a manner that plug-in connector 1b is matched with plug-in connector 16b. Attachment electronic unit 1 accommodated within housing 2 in this manner is fastened to housing 2 by means of screws 11.

After attachment electronic unit 1 is fixed to housing 2, a user rotates engaging arm 21 on pin 22 with his or her manual operation so that lid portion 21a of engaging arm 21 is brought apart from projecting portion 15. Thus, lid portion 21a is rotated in the upward direction, plug insertion recess 7 is completely opened, and inserting portion 21a is rotated in the downward direction. At this time, inserting portion 21a comes to project downwardly from the lower edge of front face 1a as a result of the rotational motion of inserting portion 21a. When inserting portion 21a is projected from the edge of front face 1a, inserting portion 21a is inserted into slot 5, whereby engaging arm 21 is brought into engagement with engaging portion 4.

Then, as shown in FIG. 3, the user inserts power supply plug 9 connected at one end of a cable to plug insertion recess 7 opened by lid portion 21a of engaging arm 21. When lid portion 21a abuts on power supply plug 9 connected to power receiving inlet 6, engaging arm 21 is brought to a second stop position in which insertion portion 21a is engaged with slot 5 as shown in FIG. 3. When engaging arm is placed in the second stop position, engagement between engaging arm 21 and slot 5 cannot be released unless power supply plug 9 is detached from plug insertion recess 7 and power supply plug 9 is disconnected from power receiving inlet 6. In this case, handle 10 is disposed at a position not conflicting with engaging arm when engaging arm 21 is brought to the second stop position by rotation.

Thereafter, power switch 8 is turned on to energize attachment electronic unit 1. When attachment electronic unit 1 is to be replaced with another attachment electronic unit due to trouble or the like, power switch 8 is turned off and power supply plug 9 is pulled out from power receiving inlet 6. When power supply plug 9 is pulled out from power receiving inlet 6, engaging arm 21 is rotated in a direction opposite to the above-mentioned direction owing to the weight of lid portion 21b, whereby engaging arm 21 is moved toward projecting portion 15.

In this way, lid portion 21a abuts on projecting portion 15 and lid portion 21a covers the lower portion of plug insertion recess 7. At the same time, when insertion portion 21a is rotated and moved upwardly, insertion portion 21a is prevented from being projected from the edge of front face 1a. With this rotational motion of engaging arm 21, insertion portion 21a can be disengaged from slot 5 and hence engagement between insertion portion 21a and slot 5 can be released. In this way, if power supply plug 9 is pulled out from plug insertion recess 7, and engaging arm is brought to a free state in which no external force is applied thereto, engaging arm 21 is rotated in such a manner that insertion portion 21a is disengaged from engaging portion 4. Then, when lid portion 21a abuts on projecting portion 15, engaging arm 21 is stopped at first stop position. As described above, if engaging arm 21 is placed at the first stop position, then plug insertion recess 7 is covered at its lower portion with engaging arm 21, with the result that power supply plug 9 is prohibited from being inserted into plug insertion recess 7. After screws 11 are removed from housing 2, the user pulls attachment electronic unit 1 out from housing 2.

As described above, according to the embodiment of the set of electronic equipment according to the present invention, if attachment electronic unit 1 is accommodated in housing 2 and attachment electronic unit 1 is connected at its power receiving inlet 6 with power supply plug 9, then attachment electronic unit 1 can be prohibited from being pulled out from housing 2. Therefore, attachment electronic unit can be prevented from being pulled out from the set of electronic equipment 31 if attachment electronic unit 1 is supplied with power through power supply plug 6. When attachment electronic unit shall be replaced with another attachment electronic unit due to trouble or the like, the user detaches power supply plug 9 from power receiving inlet 6 of attachment electronic unit 1 housed in housing 2, and thereafter pulls attachment electronic unit 1 out from housing 2.

According to the set of equipment 31 having the above-described pull-out preventing structure, if power supply plug 9 is not detached from power receiving inlet 6, the mechanism for preventing attachment electronic unit 1 from being pulled out from housing 2 cannot be released. Therefore, if power supply plug 9 is connected to power receiving inlet 6, attachment electronic unit 1 can be positively prevented from being pulled out from housing 2. Accordingly, if the user of the equipment unintentionally tries to pull attachment electronic unit 1 out from housing 2 without detaching power supply plug 9 from power receiving inlet 6, the pull-out preventing mechanism effectively prevents attachment electronic unit 1 from being pulled out from housing 2. That is, the user is allowed to pull attachment electronic unit 1 out from housing 2 only when power supply to attachment electronic unit 1 is completely cut.

Accordingly, when attachment electronic unit 1 is replaced with another attachment electronic unit or so, the set of electronic equipment is free from excessive current flow or noise generation at another place different from attachment electronic unit 1. As a result, energized circuits in the set of electronic equipment can be protected from influence coming from excessive current flow or noise generation, with the result that the energized circuits becomes free from a malfunction. If power supply plug 9 is pulled out from power receiving inlet 6 under condition that power switch 8 is turned on, a malfunction does not occur at a circuit under operation in another place different from attachment electronic unit 1. Owing to these merits, the set electronic equipment having replaceable attachment electronic unit 1 can be free from deterioration in performance thereof, and hence the user of the equipment can operate the equipment with reliance.

While a preferred embodiment of the present invention has been described using specific terms, such description is for illustrative purpose only, and it is to be understood that changes and variations may be made without departing from the spirit or scope of the following claims.

What is claimed is:

1. A pull-out preventing mechanism for an electronic housing assembly comprising:
    a rotatable engaging arm on an exterior face of an electronic unit, wherein the electronic unit is attachable and detachable received in a housing and is pluggable to a power source;
    an engaging portion on the housing, said engaging portion engagable with an end of the engaging arm said engaging portion being disengageable only when the electronic unit is not plugged to a power source,
    wherein the electronic unit is provided with an electric connecting part having an insertion recess for a plug, and
    the engaging arm has a lid portion which covers at least a part of the insertion recess when the plug is detached from the insertion recess to prohibit the plug from being inserted into the insertion recess,
    and wherein the engaging arm is v-shaped having a first end portion, a second end portion, and a bent portion, the first end portion invertible into a slot in the housing, the second end portion being the lid portion, and the bent portion being a rotation pivot at which the engaging arm is supported,
    and wherein the housing and an opening through which the electronic unit can be inserted into the housing, and the engaging portion is provided at a circumferential part of the opening, and the engaging arm is rotatably provided on the electronic unit,
    and wherein the housing has a projecting portion on which the engaging arm abuts to be placed at a first stop position in which the lid portion of the engaging arm covers at least a part of the insertion recess when the plug is disengaged from the insertion recess.

2. A pull-out preventing mechanism of an electronic unit for use in an electronic equipment including the electronic unit provided with an electric connecting part, a housing for accommodating the electronic unit so that the electronic unit can be attached to or detached from the housing, and a power supply cable having a plug to be connected to the electric connecting part, the pull-out preventing mechanism comprising:
    an engaging arm attached to a vicinity of the electric connecting part on a face of the electronic unit so as to be rotatable on the face; and
    an engaging portion provided on the housing so that the engaging portion can be engaged with one end of the engaging arm when the plug is connected to the electric connecting part, whereby the electronic unit can be prevented from being pulled out from the housing, and that the engaging portion can be disengaged from the end of the engaging arm by the rotation of the engaging arm only when the plug is detached from the electric connecting part;
    wherein the electric connecting part on the electronic unit is formed to have an insertion recess into which the plug can be inserted, and
    the engaging arm is arranged to have a lid portion which can cover at least a part of the insertion recess when the plug is detached from the insertion recess, whereby the plug is prohibited from being inserted into the insertion recess;
    wherein the engaging arm is formed into a V-letter shape having one end portion, the other end portion, and a bent portion, the one end portion of the engaging arm serving as an insertion portion which is inserted into a slot provided in the engaging portion of the housing so as to make engagement with the engaging portion, the other end portion of the engaging arm serving as the lid portion, and the bent portion serving as a rotation pivot at which the engaging arm is supported so as to be rotated around the pivot;
    and wherein the housing is formed to have an opening on one face of the housing through which the electronic unit can be inserted into the housing, and the engaging portion is provided at a part of the circumference of the opening on the face of the housing, and
    the engaging arm is rotatably provided on the electronic unit so that the engaging arm can be projected by the rotation of the engaging arm from an edge of the face of the electronic unit on which the electric connecting part is provided, whereby the insertion portion of the engaging arm is inserted into the slot of the engaging portion;

and wherein the housing is formed to have a projecting portion on which the engaging arm abuts to be placed at a first stop position in which the lid portion of the engaging arm covers at least a part of the insertion recess when the plug is disengaged from the insertion recess of the electric connecting part;

and wherein the engaging arm is arranged such that when the engaging arm is rotated so that the insertion portion of the engaging arm is inserted into the slot of the engaging portion provided on the housing, the lid portion of the engaging arm entirely opens the insertion recess of the electric connecting part, and when the insertion portion is inserted into the slot and the plug is connected to the electric connecting part, the engaging arm can be placed at a second stop position in which the lid portion of the engaging arm abuts on the plug.

3. An electronic unit housing assembly with pull-out prevention comprising:

an electronic unit with a rotatable engaging arm on an exterior face thereon;

a housing for attachable and detachable receiving the electronic unit, on which housing is provided an engaging portion engagable with the rotatable engaging arm, said engaging portion being disengageable only when the electronic is not plugged to a power source, wherein when the engaging arm is rotated in one direction and the one end of the engaging arm is engaged with the engaging portion, the electronic unit cannot be pulled out from the housing, and wherein the electronic unit is provided with an electric connecting part having an insertion recess for receiving a plug, and the engaging arm includes a lid portion which can cover at least a part of the insertion recess when the plug is detached from the insertion recess, whereby the plug is prohibited from being inserted in the insertion recess.

and wherein the engaging arm only rotates in an opposite direction to said one direction when the plug is detached from the electric connecting part, and wherein the engaging arm is v-shaped having a first end portion, a second end portion, and a bent portion, the first end portion insertible into a slot in the housing, the second end portion being the lid portion, and the bent portion being a rotation pivot at which the engaging arm is supported, and wherein the housing has an opening through which the electronic unit can be inserted into the housing, and the engaging portion is provided at a circumferential part of the opening, and the engaging arm is rotably provided on the electronic unit, and wherein the housing has projecting portion on which the engaging arm abuts to be placed at a first stop position in which the lid portion of the engaging arm covers at least a part of the insertion recess when the plug is disengaged.

4. An electronic apparatus, comprising:

an electronic unit provided with an electric connecting part;

a housing for accommodating the electronic unit so that the electronic unit can be attached to or detached from the housing;

a cable having a plug to be connected to the electric connecting part; and pull-out preventing means arranged such that when the plug is connected to the electric connecting part, the pull-out preventing means engages with the housing so as to prevent the electronic unit from being pulled out from the housing, and when the plug is detached from the electric connecting part, the pull-out preventing means can be disengaged from the housing;

wherein the pull-out preventing, means is formed of an engaging arm attached to a vicinity of the electric connecting part on a face of the electronic unit so as to be rotatable on the face, the housing is formed to have an engaging portion which can be engaged with one end of the engaging arm, and the engaging arm and the engaging portion are arranged such that when the engaging arm is rotated in one direction and the one end of the engaging arm is engaged with the engaging portion, the electronic unit can be prevented from being pulled out from the housing, and that only when the plug is detached from the electric connecting part, the engaging portion is allowed to be rotated in a direction opposite to that direction and the one end of the engaging arm can be disengaged from the engaging portion;

wherein the electric connecting part on the electronic unit is formed to have an insertion recess into which the plug can be inserted, and the engaging arm is arranged to have a lid portion which can cover at least a part of the insertion recess when the plug is detached from the insertion recess, whereby the plug is prohibited from being inserted into the insertion recess;

and wherein the housing is formed to have
(1) an opening on one face of the housing through which the electronic unit can be inserted into the housing, and the engaging portion is provided at a part of the circumference of the opening on the face of the housing; and the engaging arm is rotatably provided on the electronic unit so that the engaging arm can be projected by the rotation of the engaging arm from an edge of the face of the electronic unit on which the electric connecting part is provided, whereby the insertion portion of the engaging arm is inserted into the slot of the engaging portion, and
(2) a projecting portion on which the engaging arm abuts to be placed at a first stop position in which the lid portion of the engaging arm covers at least a part of the insertion recess when the plug is disengaged from the insertion recess of the electric connecting part;

and wherein the engaging arm is arranged such that when the engaging arm is inserted into the slot of the engaging portion provided on the housing, the lid portion of the engaging arm entirely opens the insertion recess of the electric connecting part, and when the insertion portion is inserted into the slot and the plug is connected to the electric connecting part, the engaging arm can be placed at a second stop position in which the lid portion of the engaging arm abuts the plug.

* * * * *